(12) United States Patent
Fukushi et al.

(10) Patent No.: US 6,836,426 B1
(45) Date of Patent: Dec. 28, 2004

(54) SEMICONDUCTOR MEMORY DEVICE WITH PROPER SENSING TIMING

(75) Inventors: Isao Fukushi, Kawasaki (JP); Shoichiro Kawashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/786,333

(22) Filed: Feb. 26, 2004

(30) Foreign Application Priority Data

Oct. 23, 2003 (JP) ........................................ 2003-363370

(51) Int. Cl.[7] .............................................. G11C 11/22
(52) U.S. Cl. ........................ 365/145; 365/205; 365/207
(58) Field of Search ................................ 365/145, 205, 365/207, 208, 194

(56) References Cited

U.S. PATENT DOCUMENTS

| | | | | |
|---|---|---|---|---|
| 5,208,771 A | * | 5/1993 | Shikata | ........................ 365/154 |
| 5,315,550 A | * | 5/1994 | Tobita | ........................ 365/194 |
| 6,504,789 B2 | * | 1/2003 | Hirakawa | ........................ 365/233 |
| 2002/0145918 A1 | * | 10/2002 | Maayan et al. | ........ 365/189.07 |

FOREIGN PATENT DOCUMENTS

JP  2002-133857  5/2002

OTHER PUBLICATIONS

"Passport of Internet Age, FRAM Smart Card", 2003, Fujitsu, Ltd.

"Bitling GND Sensing Technique for Low-Voltage Operation FeRAM", Kawashima et al, *IEEE Journal of Solid-State Circuits*, May, 2002, vol. 37, No. 5, pp. 592–598.

* cited by examiner

*Primary Examiner*—Vu A. Le
(74) *Attorney, Agent, or Firm*—Arent Fox PLLC

(57) ABSTRACT

A semiconductor memory device includes a memory cell, a signal line on which a potential responsive to data read from the memory cell appears, a potential detecting circuit which outputs a detection signal in response to detecting that the potential on the signal line exceeds a predetermined potential, and a sense amplifier which starts amplifying the potential on the signal line in response to the detection signal.

10 Claims, 11 Drawing Sheets

US 6,836,426 B1

SEMICONDUCTOR MEMORY DEVICE WITH PROPER SENSING TIMING

CROSS-REFERENCE TO RELATED APPLICATIONS

The present application is based upon and claims the benefit of priority from the prior Japanese Patent Application No. 2003-363370 filed on Oct. 23, 2003, with the Japanese Patent Office, the entire contents of which are incorporated herein by reference.

BACKGROUND OF THE INVENTION

1. Field of the Invention

The present invention generally relates to semiconductor memory devices, and particularly relates to a ferroelectric memory in which the latch timing of a sense amplifier is adjusted.

2. Description of the Related Art

A ferroelectric memory (FRAM, FeRAM) is used as a memory medium for an IC card or the like due to the use of a ferroelectric capacity as a memory cell that achieves the retention of data during power-off periods.

FIG. 1 is a drawing showing an example of the construction of a related-art ferroelectric memory. The circuit shown in FIG. 1 is a portion relevant to the reading of a ferroelectric memory, and includes 2T2C-type (2-transistor-and-2-capacitor-type) memory cell 1, a pre-sense amplifier 2, a pre-sense amplifier 3, a Vth generating circuit 4, a minus voltage generating circuit 5, and a sense amplifier 6.

In actual construction, a plurality of memory cells 1 is arranged in a matrix form. For the sake of simplicity of illustration, however, only one cell is shown in FIG. 1. In the memory cell 1, a word line WL, a plate line PL, bit lines BL and BLX, access transistors N1 and N2, and ferroelectric capacitors F1 and F2 are provided.

In the ferroelectric memory, a write operation is performed by applying a positive or negative voltage to the ferroelectric capacitors for polarization, and a read operation is performed by detecting the presence/absence of a reversed polarization current when a positive voltage is applied to the ferroelectric capacitors. In the write operation, the word line WL is placed in a selected state (HIGH), thereby turning on the access transistor N1. When a positive or negative voltage is applied between the bit line BL and the plate line PL, this voltage is applied to the ferroelectric capacitor F1, resulting in desired data being stored. When writing "0" data, the bit line BL is set to 0 V, and the plate line PL is set to a power supply voltage VDD. When writing "1" data, the bit line BL is set to the power supply voltage VDD, and the plate line PL is set to 0 V. By following the same procedure, the ferroelectric capacitor F1 stores data that is inverse to the data stored in the ferroelectric capacitor F2. Since the polarization of the ferroelectric capacitors is retained even after the applied voltage is removed following the write operation, the stored data remains as nonvolatile data.

In a read operation, the word line WL is selectively activated to turn on the access transistor N1, and the plate line PL is set to the power supply voltage VDD. The bit line BL is maintained substantially at a ground potential GND by the pre-sense amplifier 2, and a positive voltage is applied to the ferroelectric capacitor F1. When "0" is stored in the ferroelectric capacitor F1, the voltage applied to the ferroelectric capacitor F1 has the same polarity as used in the write operation, thereby resulting in no reversal of polarization. In this case, comparatively small electric charge flows into the bit line BL. When "1" is stored in the ferroelectric capacitor F1, the voltage applied to the ferroelectric capacitor F1 has a reversed polarity compared with the polarity used in the write operation, thereby resulting in the reversal of polarization. In this case, comparatively large electric charge flows into the bit line BL. The pre-sense amplifier 2 detects this current, and converts it into a voltage signal. By the same token, the pre-sense amplifier 3 detects a current from the ferroelectric capacitor F2, and converts it into a voltage signal. The sense amplifier 6 amplifies a difference of the output potentials of the pre-sense amplifiers 2 and 3 up to the level of the power supply voltages VDD and GND.

The pre-sense amplifier 2 includes switches S1 and S3, a Pch-MOS transistor P1, and capacitors C1 and C3. The pre-sense amplifier 3 includes switches S2 and S4, a Pch-MOS transistor P2, and capacitors C2 and C4. The sense amplifier 6 includes Pch-MOS transistors P3–P7, Nch-MOS transistors N3–N7, switches S5 and S6, and an inverter I1.

FIG. 2 is a diagram showing signal waveforms for explaining the operation of the related-art circuit of FIG. 1. In the following, a description will be given of the operation of the circuit of FIG. 1 with reference to FIG. 2.

Data "1" is stored in the ferroelectric capacitor F1, and data "0" is stored in the ferroelectric capacitor F2. In FIG. 2, the switches S1 and S2 are ON (i.e., closed) up to timing T1, so that the bit lines BL and BLX are fixed to the ground potential GND. After timing T1, the switches S1 and S2 are OFF (i.e., open), so that the bit lines BL and BLX are released. The Vth generating circuit 4 generates a potential that is equal to Vth (MOS threshold value) when the sources (i.e., the bit lines BL and BLX) of the Pch-MOS transistors P1 and P2 are at the ground potential GND. This potential is lower than GND.

The minus voltage generating circuit 5 generates a negative potential VMINUS. The negative potential VMINUS is −3 V, for example. The switches S3 and S4 are ON until timing T1, thereby setting the drains (i.e., nodes MINUS and MINUSX) of the Pch-MOS transistors P1 and P2 to the negative potential VMINUS. After timing T1, the switches S3 and S4 are OFF, so that the nodes MINUS and MINUSX are released. From timing T1 to timing T2, the potential of the nodes MINUS and MINUSX is maintained at the negative potential VMINUS by means of the capacitors C1 and C2.

At timing T2, the word line WL and the plate line PL are changed to VDD (e.g., 3 V). The access transistors N1 and N2 are turned on, and a positive voltage is applied to the ferroelectric capacitors F1 and F2. Since the ferroelectric capacitor F1 with stored data "1" receives a voltage having an opposite polarity compared with the polarity used in the write operation, a large amount of reversed electric charge flows into the bit line BL due to the reversal of polarization. In response, the potential of the bit line BL tries to rise. Since Vth is being applied to the gate of the Pch-MOS transistor P1, even a slight increase in the potential of the bit line BL causes the Pch-MOS transistor P1 to turn on. Because of this, electric charge equal to the reversed electric charge flows from the bit line BL to the node MINUS, maintaining the potential of the bit line BL close to GND. In response to the influx of reversed electric charge, the potential of the node MINUS that was held steady by the capacitor C1 rises significantly, as shown in FIG. 2.

The voltage applied to the ferroelectric capacitor F2 with stored data "0", on the other hand, has the same polarity as used in write operation, resulting in no reversal of polarization. In this case, comparatively small electric charge flows into the bit line BLX. In response, the potential of the bit line BLX tries to rise. Since Vth is being applied to the gate of the Pch-MOS transistor P2, even a slight increase in the potential of the bit line BLX causes the Pch-MOS transistor P2 to turn on. Because of this, electric charge flows from the bit line BLX to the node MINUSX, maintaining the potential of the bit line BLX close to GND. With the inflow of electric charge, the potential of the node MINUSX that was held steady by the capacitor C2 rises as shown in FIG. 2. Since the stored data is "0", the rise of the potential of the node MINUSX is smaller than the rise of the potential of the node MINUS.

The switches S5 and S6 of the sense amplifier 6 are ON until timing T1, so that respective terminals OUT and OUTX of the capacitors C3 and C4 are fixed to GND until timing T1. The opposite ends MINUS and MINUSX of the capacitors C3 and C4 are fixed to the negative potential VMINUS until the timing T1, as previously described. After timing T1, the switches S5 and S6 are OFF, so that the nodes OUT and OUTX are released. Since the capacitors C3 and C4 keep the potential difference between their respective opposite ends, the potentials of the nodes OUT and OUTX change in the same manner as the potential changes of the nodes MINUS and MINUSX, respectively. Thus, the potential waveforms of the nodes OUT and OUTX are the same as the potential waveforms of the nodes MINUS and MINUSX, respectively, with an upward potential shift by |VMINUS|, which results in positive potentials being obtained with the ground potential GND serving as a reference.

The sense amplifier 6 is a latch-type sense amplifier, which latches the nodes OUT and OUTX as its inputs, and amplifies the inputs to VDD and GND. The MOS transistors P4, P5, N4, and N5 together make up two inverters that are cross-coupled to each other. The MOS transistors P3 and N3 serve as switches for disconnecting these two inverters from a power supply. The MOS transistors P6, N6, P7, and N7 are transfer gates. Up to timing T3, a latch drive signal SAPOWER is LOW, so that the two inverters cross-coupled to each other are disconnected from the power supply, being placed in a floating state. The transfer gates are ON, so that the nodes OUT and OUTX are respectively coupled to nodes SAOUT and SAOUTX situated at the cross-coupling points. When the latch drive signal SAPOWER changes to HIGH at timing T3, the transfer gates become nonconductive, and the two cross-coupled inverters are turned on. In response, the potentials of the nodes SAOUT and SAOUTX are amplified to a full range between VDD and GND. These amplified signals are provided as read outputs.

It should be noted that switching operations and amplification operations in a read operation are the same as those described above even if data "0" is stored in the ferroelectric capacitor F1 and data "1" is stored in the ferroelectric capacitor F2 in an opposite manner to the above example.

[Patent Document 1] Japanese Patent Application Publication No. 2002-133857

[Non-Patent Document 1] "Passport of Internet Age, FRAM Smart Card," 2003, FUJITSU, LTD., <URL:http://edevice.fujitsu.com/fj/CATALOG/AD05/05-00023/index_j.html>

[Non-Patent Document 2] Shoichiro Kawashima, et. al., IEEE Journal of Solid-State Circuits, May, 2002, Vol. 37, No. 5, pp. 592–598

FIG. 3 is an expanded view of the waveforms of the nodes OUT and OUTX and the latch drive signal SAPOWER shown in FIG. 2. In FIG. 3, the potentials of the nodes OUT and OUTX rise in response to the reading of a memory cell, providing a potential difference ΔV at timing T3 when the sense amplifier 6 starts an operation. The sense amplifier 6 amplifies this potential difference that is received as an input. In general, the characteristics of ferroelectric have large manufacturing variation, and temperature and power supply dependency is also strong. Moreover, the waveform of the potential of the nodes OUT and OUTX is also affected by relative variation between the capacitors F1 and F2 of the memory cell and the capacitors C1 and C2.

If the capacitors F1 and F2 of the memory cell are larger than design specs due to manufacturing variation or temperature and power supply dependency, the potential of the nodes OUT and OUTX may excessively rise as shown in FIG. 4. In this case, the potential of the node OUT corresponding to the reading of data "1" exceeds VDD (e.g., 3 V) to saturate approximately at VDD+0.6 V. This is because, with the back gate of the Pch-MOS transistor P1 in the pre-sense amplifier 2 being connected to GND, the PN junction between the sauce/drain and the back gate becomes a forward direction in response to the potential of the source/drain trying to exceed about +0.6 V, which results in the flow of a current that prevents the potential of the source/drain from rising. That is, the potential of the node MINUS does not exceed a certain point that is approximately at +0.6 V, and the potential of the node OUT does not rise above a certain point that is approximately at VDD+0.6 V.

On the other hand, the potential of the node OUTX corresponding to the reading of data "0" continues to rise with time because there is still some distance to go before reaching the saturation point.

If timing T3 is positioned as illustrated in FIG. 4, only a relatively small potential difference ΔV is obtained at the latch timing T3 whereas a sufficiently large potential difference ΔV' is produced at timing earlier than the latch timing T3. In this case, the sense amplifier 6 may sense data incorrectly due to the small potential difference that it receives. Moreover, the sense amplifier 6 is a latch-type sense amplifier, so that its gain is largest around VDD/2. When both of the two inputs are close to VDD as shown in FIG. 4, the gain is small, resulting in an increase of the possibility of incorrect sensing.

Accordingly, there is a need for a semiconductor memory device in which the latch timing is adjusted in response to manufacturing variation and/or temperature and power supply dependency of ferroelectric, thereby providing for a latch operation to be performed with respect to a sufficiently large potential difference at a position that is not close to VDD.

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device, including a memory cell, a signal line on which a potential responsive to data read from the memory cell appears, a potential detecting circuit which outputs a detection signal in response to detecting that the potential on the signal line exceeds a predetermined potential, and a sense amplifier which starts amplifying the potential on the signal line in response to the detection signal.

In the semiconductor memory device described above, the potential detecting circuit detects that the potential responsive to the read data exceeds the predetermined potential, and the sense amplifier amplifies the data (i.e., performs a latch operation) at timing responsive to such a detection. Accordingly, the latch operation is performed at earlier timing where a rise of the data potential is excessively rapid, performed at standard timing where a rise of the data potential is standard, and performed at later timing where a rise of the data potential is excessively slow. With this provision, the latch timing is adjusted according to manufacturing variation and/or temperature and power supply dependency of ferroelectric, thereby achieving accurate data sensing by latching sense amplifier inputs having a sufficiently large potential difference at a position that is not close to VDD.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
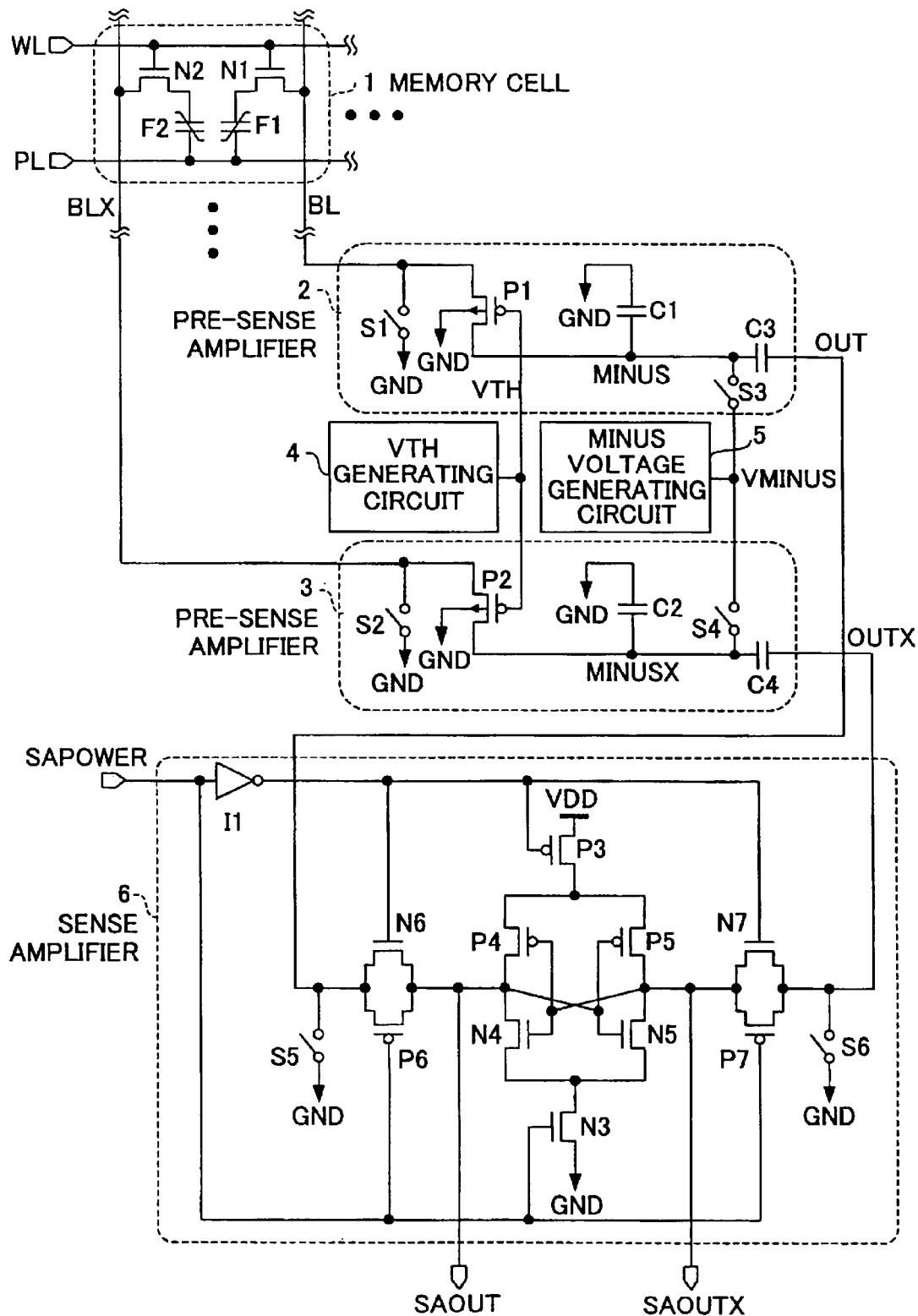
FIG. 1 is a drawing showing an example of the construction of a related-art ferroelectric memory.
Figure 2:
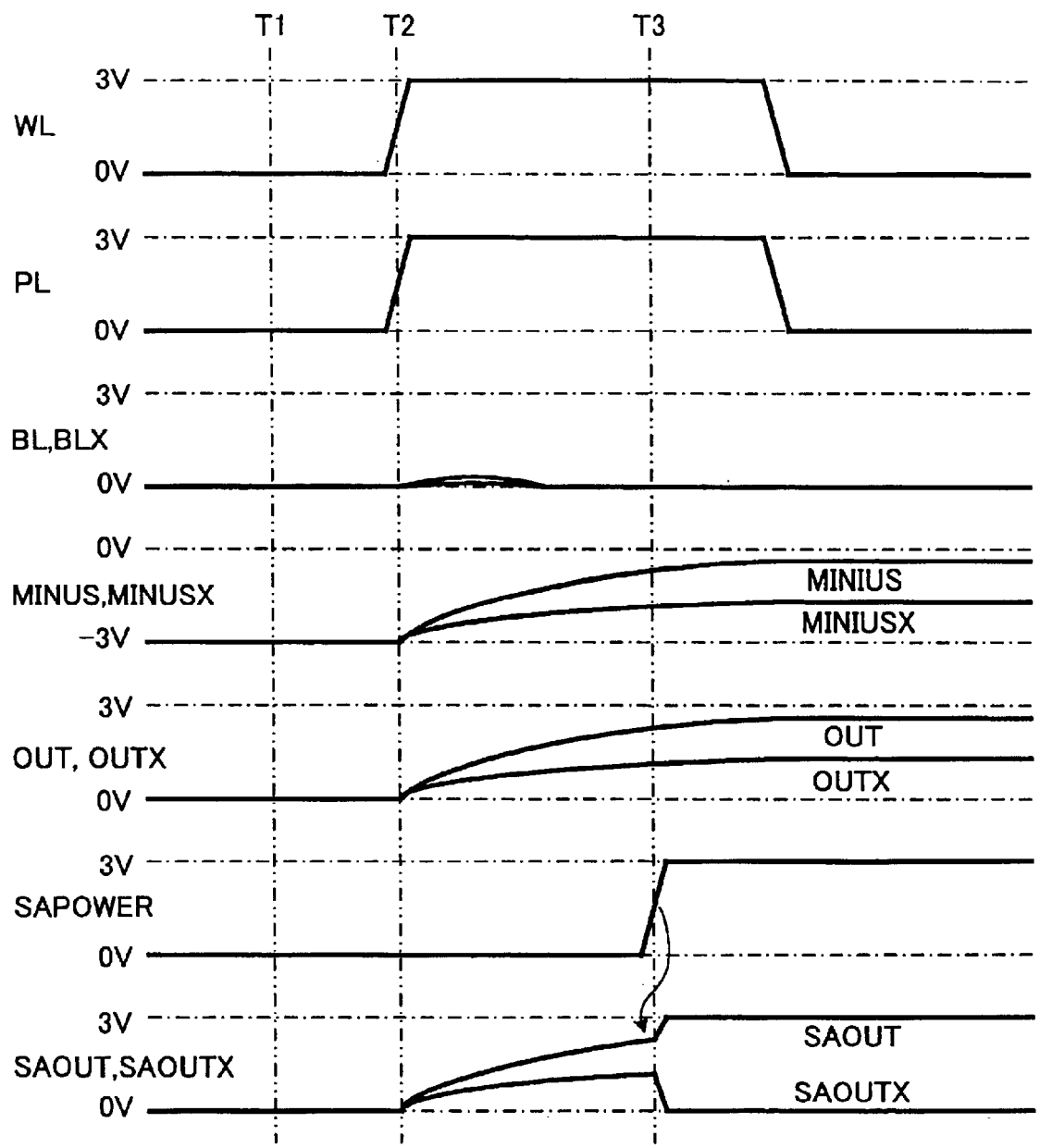
FIG. 2 is a diagram showing signal waveforms for explaining the operation of the related-art circuit of FIG. 1.
Figure 3:
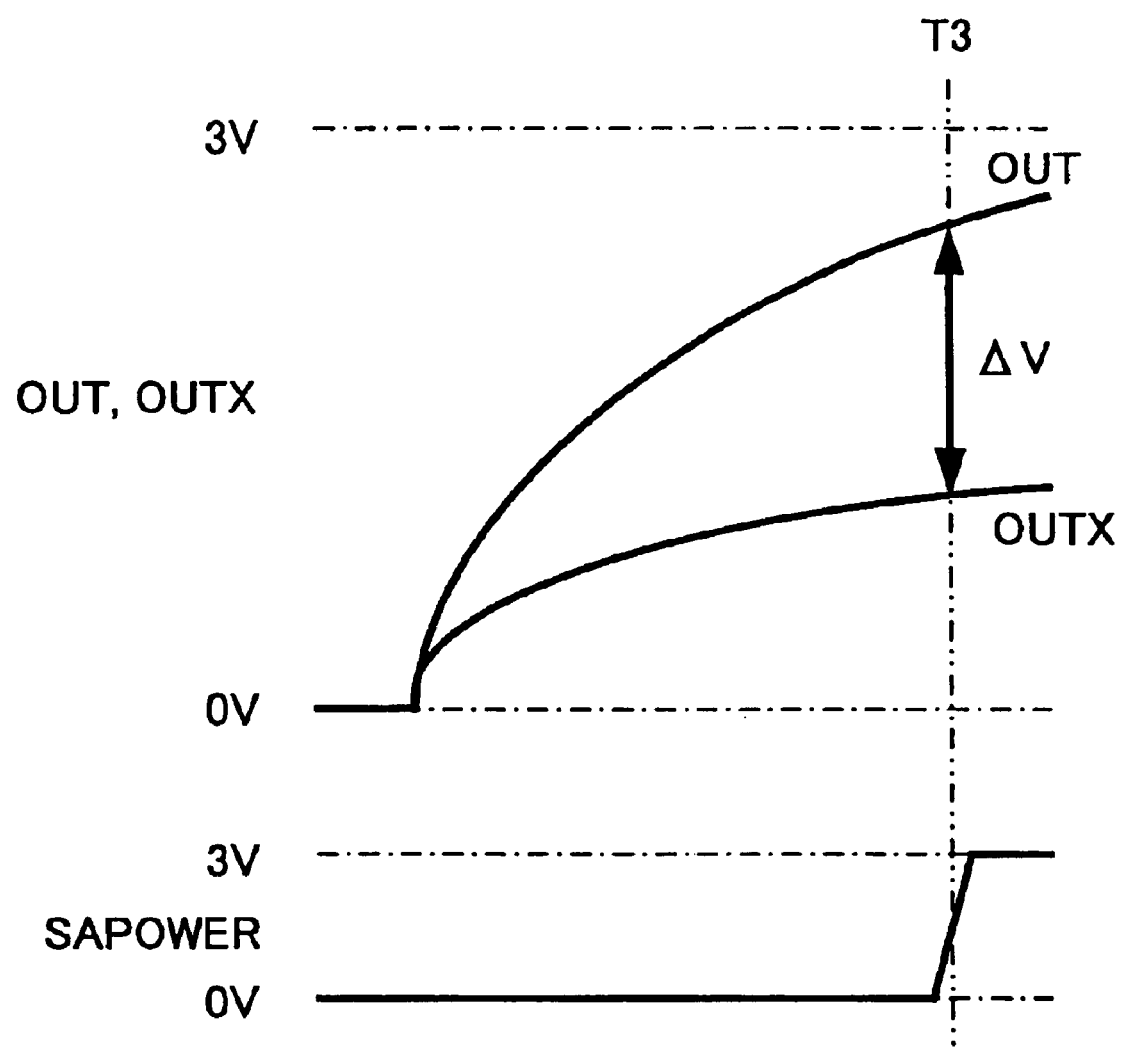
FIG. 3 is an expanded view of the waveforms of nodes OUT and OUTX and a latch drive signal SAPOWER shown in FIG. 2.
Figure 4:
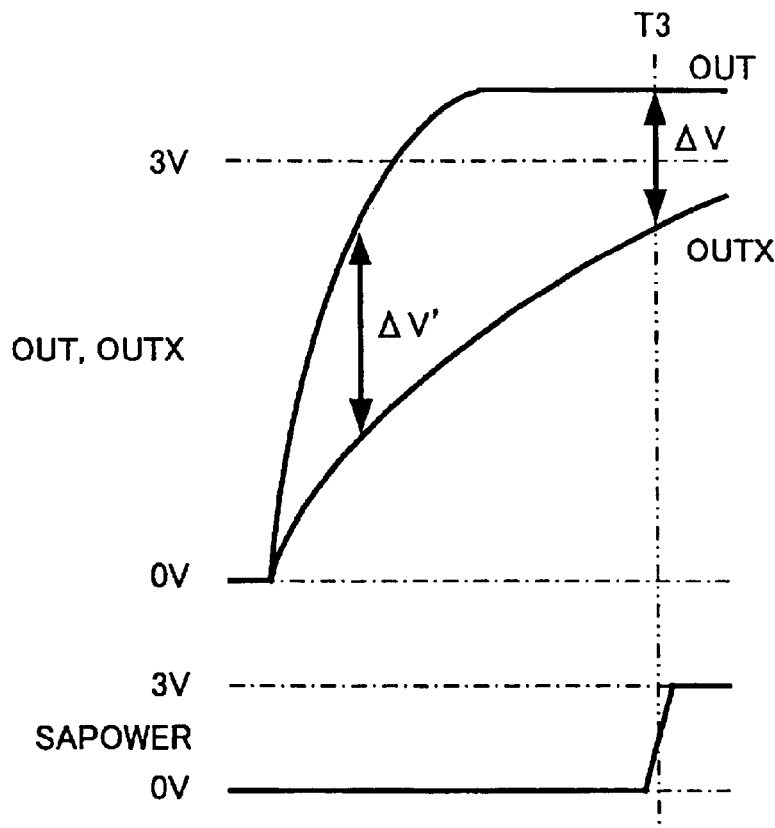
FIG. 4 is a diagram showing a case in which node potentials show an excessive rise.
Figure 5:
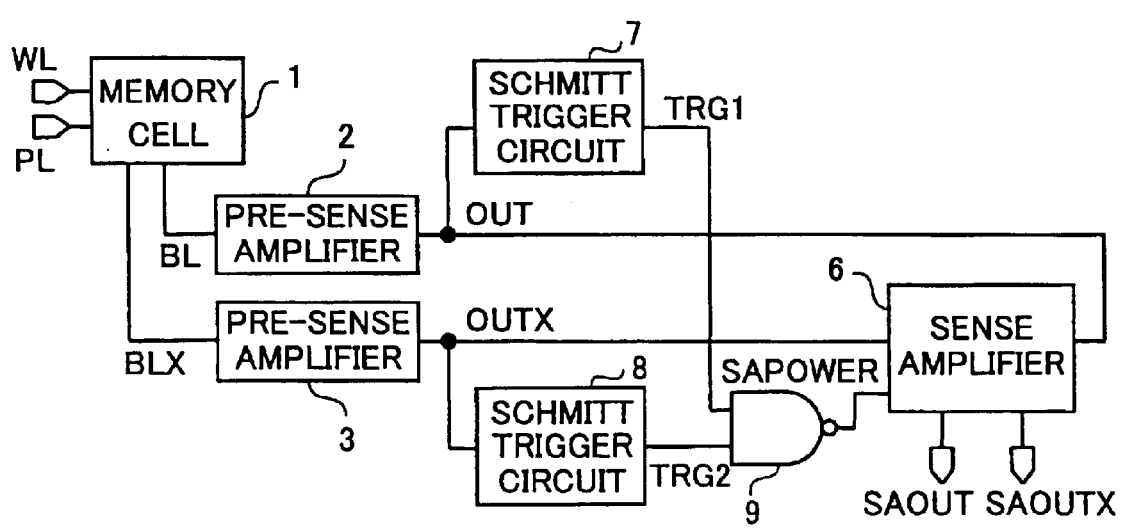
FIG. 5 is a block diagram showing an example of the construction of a ferroelectric memory according to the invention.

FIG. 5 is a block diagram showing an example of the construction of a ferroelectric memory according to the invention. In FIG. 5, the same elements as those of FIG. 1 are referred to by the same numerals, and a description thereof will be omitted.

The circuit shown in FIG. 5 is a portion relevant to the reading of a ferroelectric memory, and includes the 2T2C-type (2-transistor-and-2-capacitor-type) memory cell 1, the pre-sense amplifier 2, the pre-sense amplifier 3, the sense amplifier 6, a Schmitt trigger circuit 7, a Schmitt trigger circuit 8, and a NAND circuit 9. In the invention illustrated in FIG. 5, the Schmitt trigger circuits 7 and 8 function as a potential detecting means to detect an event that the potential of the respective nodes OUT and OUTX reaches a predetermined potential. In response to the detection of such event, the Schmitt trigger circuits 7 and 8 generate a latch drive signal SAPOWER, which starts the latch operation of the sense amplifier 6.

Specifically, the Schmitt trigger circuits 7 and 8 are connected to the nodes OUT and OUTX of the pre-sense amplifiers 2 and 3, respectively, and respective outputs TRG1 and TRG2 are supplied to the sense amplifier 6 as the latch drive signal SAPOWER through the NAND gate 9. The outputs of the Schmitt trigger circuits 7 and 8 are negative logic, so that the outputs TRG1 and TRG2 prior to the rising of the respective nodes OUT and OUTX are HIGH. Under this condition, the latch drive signal SAPOWER output from the NAND gate 9 is LOW. After the start of a read operation, the potential of the node OUT, for example, reaches a positive transition threshold of the input of the Schmitt trigger circuit, resulting in the output TRG1 changing from HIGH to LOW. In response, the latch drive signal SAPOWER changes to HIGH, causing the sense amplifier 6 to start operation.

Figure 6:
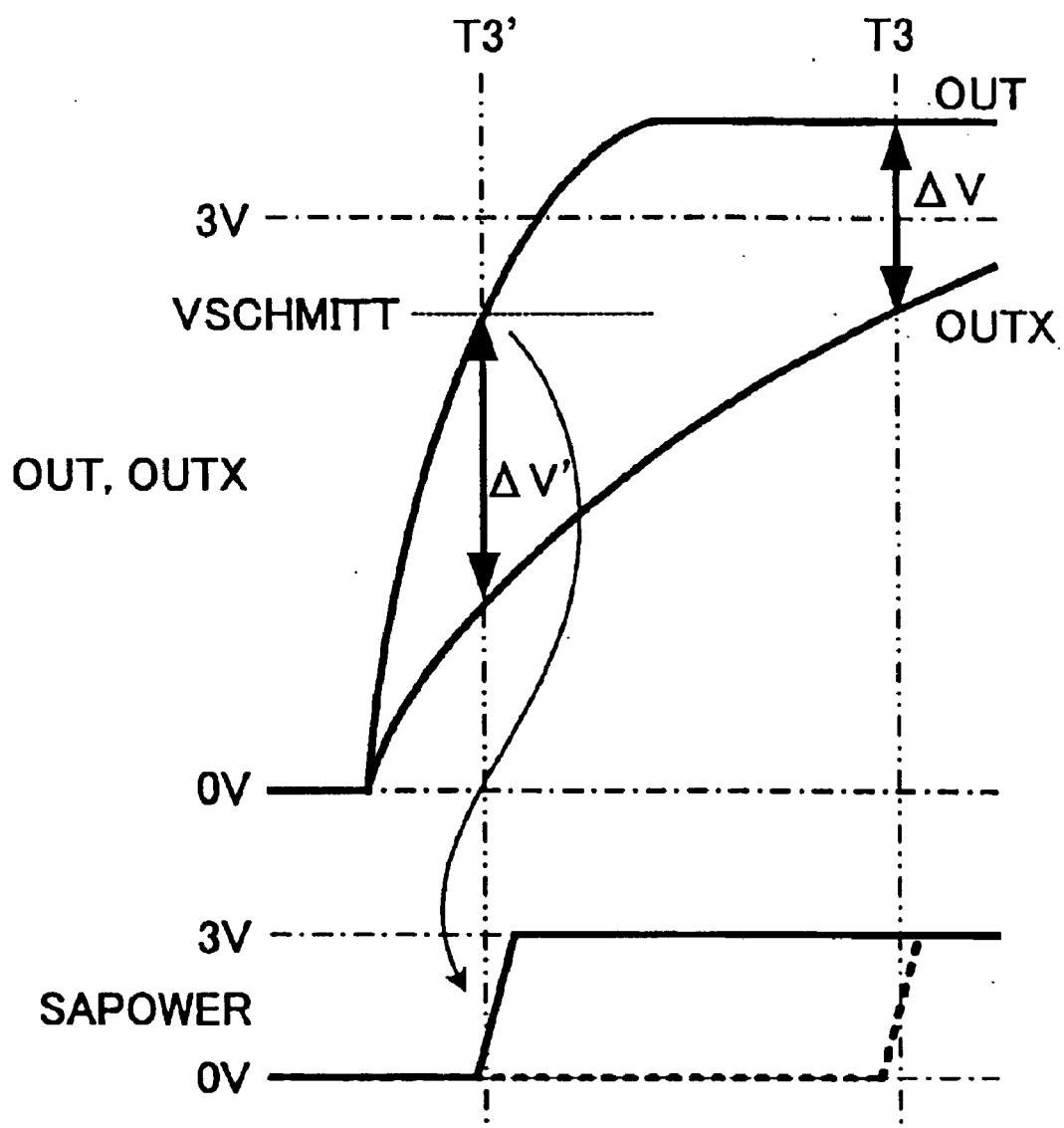
FIG. 6 is a diagram showing the voltage waveforms of the nodes OUT and OUTX and the latch drive signal SAPOWER of FIG. 5.

FIG. 6 is a diagram showing the voltage waveforms of the nodes OUT and OUTX and the latch drive signal SAPOWER of FIG. 5.

FIG. 6 illustrates a case in which the potentials of the nodes OUT and OUTX rise excessively due to manufacturing variation and/or temperature and power supply dependency of memory cell capacitors. As previously described, the node OUT saturates, so that a potential difference ΔV is small at the timing T3 of the related-art latch drive signal SAPOWER shown by a dotted line. Moreover, the potentials of the nodes OUT and OUTX are both located close to VDD where the sense amplifier 6 has a small gain. In the invention, the latch drive signal SAPOWER is generated at timing T3' when the potential of the node OUT reaches a positive transition threshold VSCHMITT of the input of the Schmitt trigger circuit 7. In response, the sense amplifier 6 starts operation while a sufficiently large potential difference ΔV' is secured at the latch timing (T3'). Moreover, since the potentials of the nodes OUT and OUTX are close to VDD/2, the sense amplifier 6 provides a sufficient gain.

Figure 7:
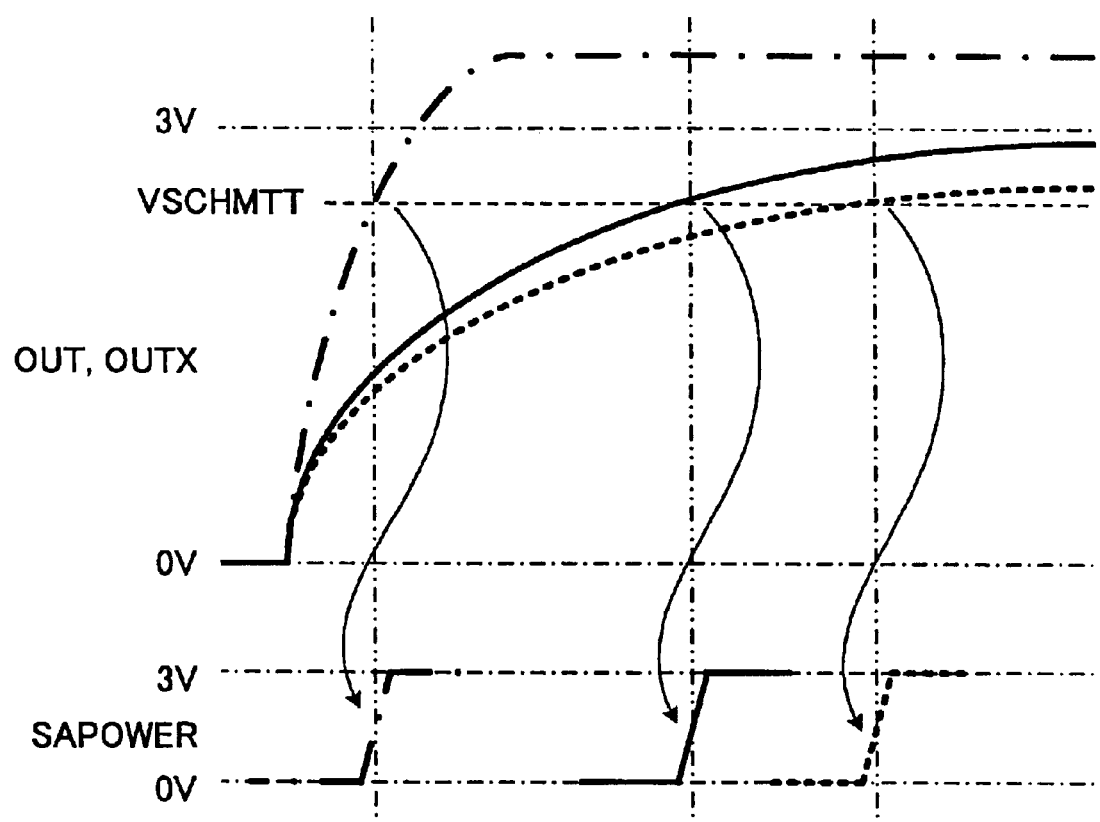
FIG. 7 is a diagram showing signal waveforms for illustrating the timing of the latch drive signal SAPOWER according to the invention when the potentials of the nodes OUT and OUTX vary due to manufacturing variation and/or temperature and power supply dependency of memory cell capacitors.

FIG. 7 is a diagram showing signal waveforms for illustrating the timing of the latch drive signal SAPOWER according to the invention when the potentials of the nodes OUT and OUTX vary due to manufacturing variation and/or temperature and power supply dependency of memory cell capacitors.

Dashed and dotted lines illustrate a case in which the potentials of the nodes OUT and OUTX are relatively high, and solid lines show a case in which these potentials are at standard levels, with dotted lines demonstrating a case in which the potentials are relatively low. In either one of these cases, the latch drive signal SAPOWER is generated when any one of the nodes OUT and OUTX reaches the positive transition threshold VSCHMITT of the input of the Schmitt trigger circuit, thereby starting the latch operation of the sense amplifier at proper timing.

Figure 8:
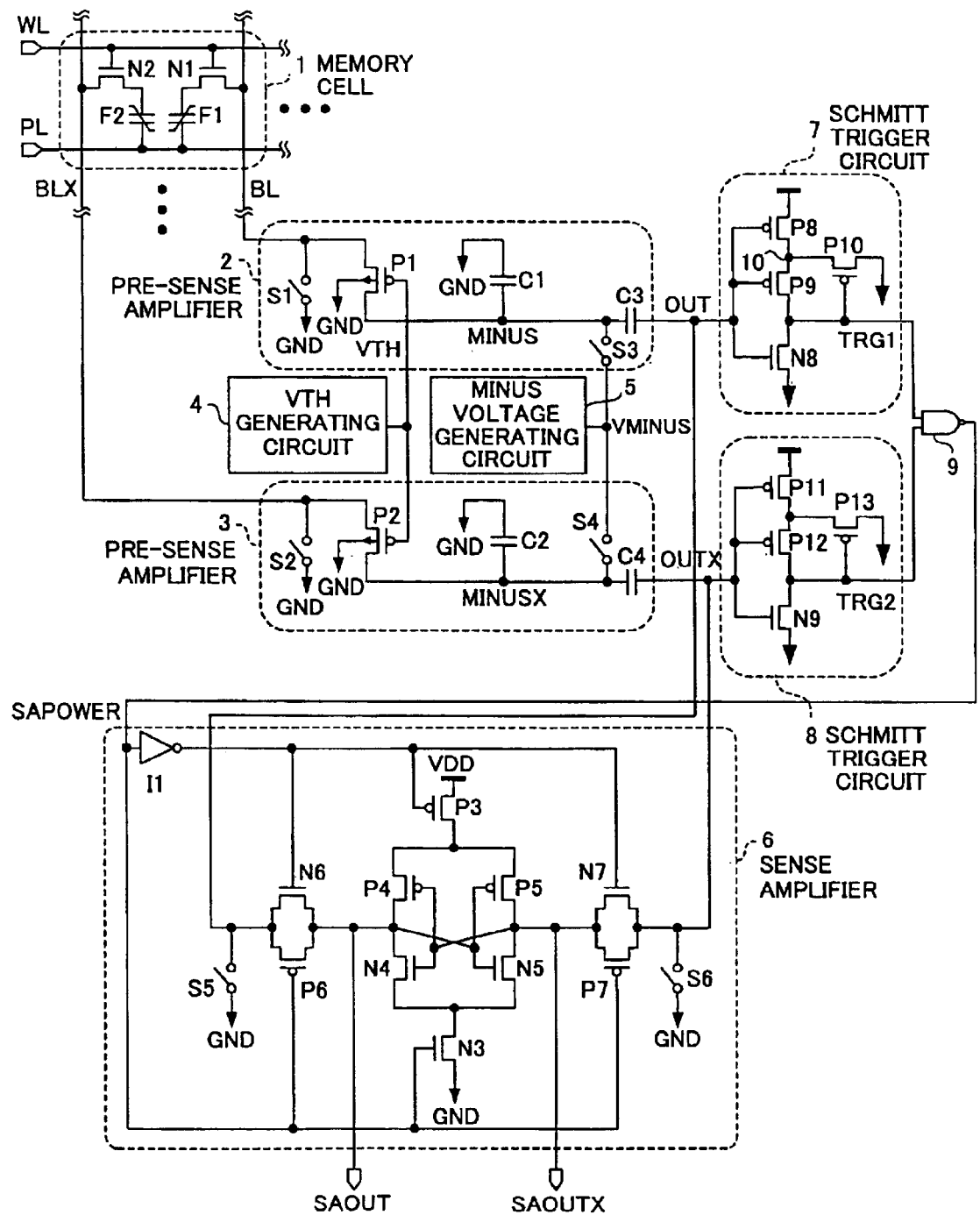
FIG. 8 is a circuit diagram showing an example of the detailed construction of the ferroelectric memory according to the invention.

FIG. 8 is a circuit diagram showing an example of the detailed construction of the ferroelectric memory according to the invention. In FIG. 8, the same elements as those of FIGS. 1 and 5 are referred to by the same numerals. The circuit shown in FIG. 8 is a portion relevant to the reading of the ferroelectric memory, and includes the 2T2C-type (2-transistor-and-2-capacitor-type) memory cell 1, the pre-sense amplifier 2, the pre-sense amplifier 3, the Vth generating circuit 4, the minus voltage generating circuit 5, the sense amplifier 6, the Schmitt trigger circuit 7, the Schmitt trigger circuit 8, and the NAND circuit 9.

In actual construction, a plurality of memory cells 1 is arranged in a matrix form. For the sake of simplicity of illustration, however, only one cell is shown in FIG. 8. In the memory cell 1, the word line WL, the plate line PL, the bit lines BL and BLX, the access transistors N1 and N2, and the ferroelectric capacitors F1 and F2 are provided.

The pre-sense amplifier 2 includes the switches S1 and S3, the Pch-MOS transistor P1, and the capacitors C1 and C3. The pre-sense amplifier 3 includes the switches S2 and S4, the Pch-MOS transistor P2, and the capacitors C2 and C4. The sense amplifier 6 includes the Pch-MOS transistors P3–P7, the Nch-MOS transistors N3–N7, the switches S5 and S6, and the inverter I1.

The Schmitt trigger circuit 7 includes Pch-MOS transistors P8–P10 and an Nch-MOS transistor N8. The Schmitt trigger circuit 8 includes Pch-MOS transistors P11–P13 and an Nch-MOS transistor N9.

Figure 9:
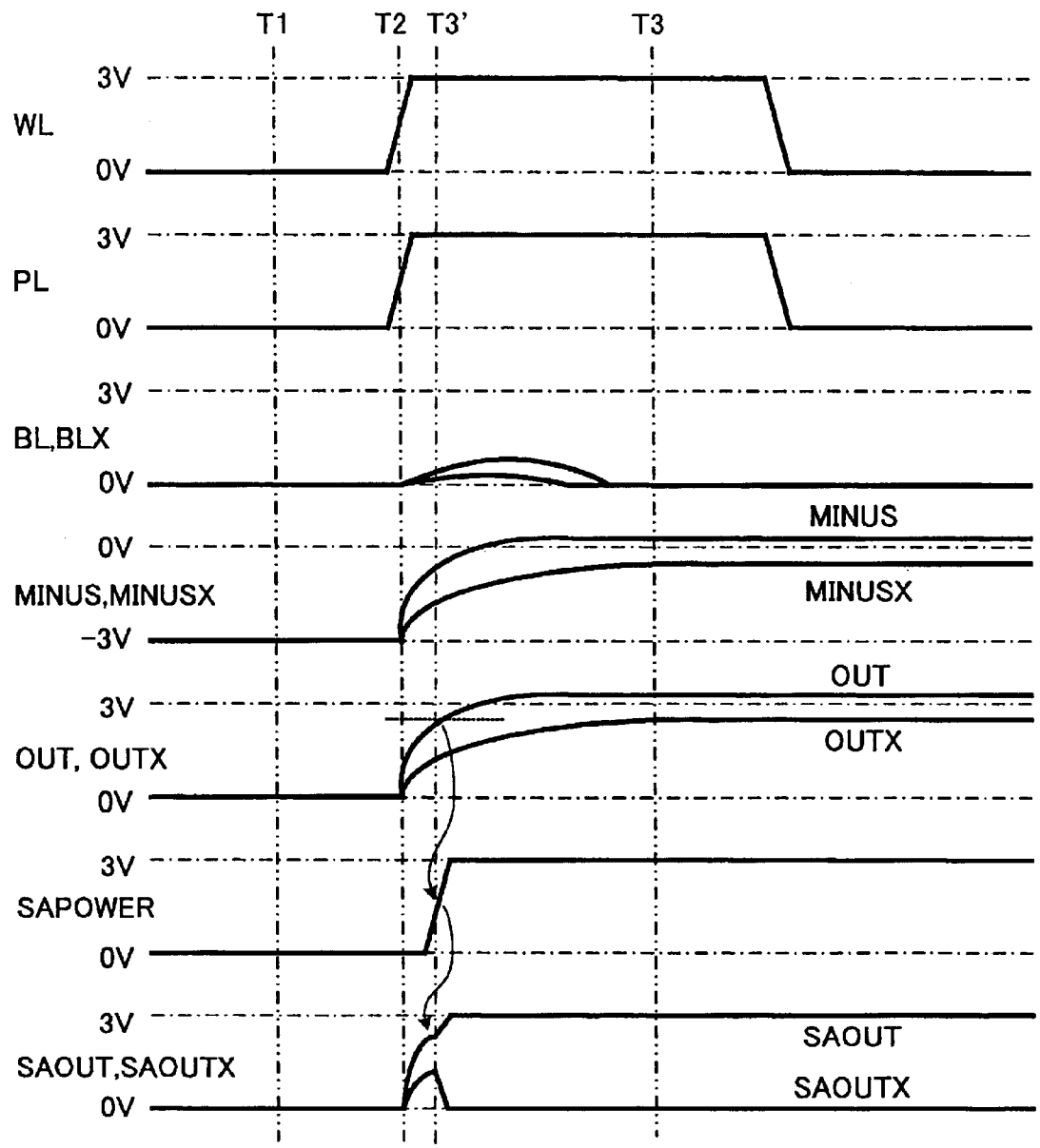
FIG. 9 is a diagram showing signal waveforms for explaining the operation of the circuit of FIG. 8.

FIG. 9 is a diagram showing signal waveforms for explaining the operation of the circuit of FIG. 8. In the following, a description will be given of the operation of the circuit of FIG. 8 with reference to FIG. 9.

FIG. 9 illustrates a case in which the potentials of the nodes OUT and OUTX rise excessively due to manufacturing variation and/or temperature and power supply dependency of the memory cell capacitors. Data "1" is stored in the ferroelectric capacitor F1, and data "0" is stored in the ferroelectric capacitor F2. In FIG. 9, the switches S1 and S2 are ON (i.e., closed) until timing T1, so that the bit lines BL and BLX are fixed to the ground potential GND. After the timing T1, the switches S1 and S2 are OFF (i.e., open), so that the bit lines BL and BLX are released. The Vth generating circuit 4 generates a potential that is equal to Vth (MOS threshold value) when the sources (i.e., the bit lines BL and BLX) of the Pch-MOS transistors P1 and P2 are at the ground potential GND. This potential is lower than GND.

The minus voltage generating circuit 5 generates a negative potential VMINUS. The negative potential VMINUS is –3 V, for example. The switches S3 and S4 are ON until the timing T1, thereby setting the drains (i.e., nodes MINUS and MINUSX) of the Pch-MOS transistors P1 and P2 to the negative potential VMINUS. After the timing T1, the switches S3 and S4 are OFF, so that the nodes MINUS and MINUSX are released. From the timing T1 to timing T2, the potential of the nodes MINUS and MINUSX is maintained at the negative potential VMINUS by means of the capacitors C1 and C2.

At the timing T2, the word line WL and the plate line PL are changed to VDD (e.g., 3 V). The access transistors N1 and N2 are turned on, and a positive voltage is applied to the ferroelectric capacitors F1 and F2. Since the ferroelectric capacitor F1 with stored data "1" receives a voltage having an opposite polarity compared with the polarity used in the write operation, a large amount of reversed electric charge flows into the bit line BL due to the reversal of polarization. In response, the potential of the bit line BL tries to rise. Since Vth is being applied to the gate of the Pch-MOS transistor P1, even a slight increase in the potential of the bit line BL causes the Pch-MOS transistor P1 to turn on. Because of this, electric charge equal to the reversed electric charge flows from the bit line BL to the node MINUS, maintaining the potential of the bit line BL close to GND. In response to the influx of reversed electric charge, the potential of the node MINUS that was held steady by the capacitor C1 rises significantly, as shown in FIG. 9.

The voltage applied to the ferroelectric capacitor F2 with stored data "0", on the other hand, has the same polarity as used in the write operation, resulting in no reversal of polarization. In this case, comparatively small electric charge flows into the bit line BLX. In response, the potential of the bit line BLX tries to rise. Since Vth is being applied to the gate of the Pch-MOS transistor P2, even a slight increase in the potential of the bit line BLX causes the Pch-MOS transistor P2 to turn on. Because of this, electric charge flows from the bit line BLX to the node MINUSX, maintaining the potential of the bit line BLX close to GND. With the inflow of electric charge, the potential of the node MINUSX that was held steady by the capacitor C2 rises as shown in FIG. 9. Since the stored data is "0", the rise of the potential of the node MINUSX is smaller than the rise of the potential of the node MINUS.

The switches S5 and S6 of the sense amplifier 6 are ON until the timing T1, so that respective terminals OUT and OUTX of the capacitors C3 and C4 are fixed to GND until the timing T1. The opposite ends MINUS and MINUSX of the capacitors C3 and C4 are fixed to the negative potential VMINUS until the timing T1, as previously described. After the timing T1, the switches S5 and S6 are OFF, so that the nodes OUT and OUTX are released. Since the capacitors C3 and C4 keep the potential difference between their respective opposite ends, the potentials of the nodes OUT and OUTX change in the same manner as the potential changes of the nodes MINUS and MINUSX, respectively. Thus, the potential waveforms of the nodes OUT and OUTX are the same as the potential waveforms of the nodes MINUS and MINUSX, respectively, with an upward potential shift by |VMINUS|, which results in positive potentials being obtained with the ground potential GND serving as a reference.

The inputs of the Schmitt trigger circuits 7 and 8 are connected to the nodes OUT and OUTX, respectively. In the initial state, the nodes OUT and OUTX are at the ground potential GND, and the outputs TRG1 and TRG2 of the Schmitt trigger circuits 7 and 8 are HIGH. In this case, the latch drive signal SAPOWER, which is the output of the NAND gate 9, is LOW.

After the start of a read operation, the potentials of the nodes OUT and OUTX rise. In the example shown in FIG. 9, the node OUT is the first to reach the positive transition threshold VSCHMITT of the input of the Schmitt trigger circuit 7 at timing T3'. In response, the output TRG1 changes from HIGH to LOW, and the latch drive signal SAPOWER that is the output of the NAND gate changes to HIGH. The nodes OUT and OUTX exhibit a gentle increase. Even if these nodes fluctuate to some extent, the Schmitt trigger circuits 7 and 8 do not change thier outputs by detecting minute fluctuation of the inputs after the outputs are changed once. That is, no chattering occurs. The operation of the Schmitt trigger circuits will be described later in detail.

The sense amplifier 6 is a latch-type sense amplifier, which latches the nodes OUT and OUTX as its inputs, and amplifies the inputs to VDD and GND. The MOS transistors P4, P5, N4, and N5 together make up two inverters that are cross-coupled to each other. The MOS transistors P3 and N3 serve as switches for disconnecting these two inverters from a power supply. The MOS transistors P6, N6, P7, and N7 are transfer gates. Up to timing T3', the latch drive signal SAPOWER is LOW, so that the two inverters cross-coupled to each other are disconnected from the power supply, being placed in a floating state. The transfer gates are ON, so that the nodes OUT and OUTX are respectively coupled to the nodes SAOUT and SAOUTX situated at the cross-coupling points. When the latch drive signal SAPOWER changes to HIGH at the timing T3', the transfer gates become nonconductive, and the two cross-coupled inverters are turned on. In response, the potentials of the nodes SAOUT and SAOUTX are amplified to a full range between VDD and GND. These amplified signals are provided as read outputs.

In this manner, the Schmitt trigger circuits 7 and 8 detect the potentials of the nodes OUT and OUTX to generate the latch drive signal, thereby starting the latch operation of the sense amplifier at proper timing even if the potentials of the nodes OUT and OUTX rise rapidly. It should be noted that switching operations and amplification operations in a read operation are the same as those described above even if data "0" is stored in the ferroelectric capacitor F1 and data "1" is stored in the ferroelectric capacitor F2 in an opposite manner to the above example. It should also be noted that the capacitors C1–C4 may alternatively be ferroelectric capacitors.

Figure 10:
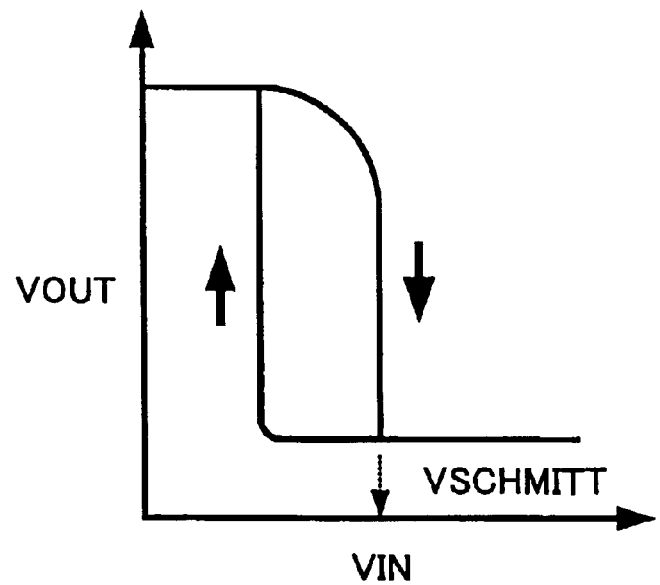
FIG. 10 is a diagram showing the input-and-output characteristics of a Schmitt trigger circuit shown in FIG. 8.

FIG. 10 is a diagram showing the input-and-output characteristics of the Schmitt trigger circuit 7 shown in FIG. 8. The Schmitt trigger circuit 8 also has the same input-and-output characteristics as illustrated in FIG. 10.

When the input of the Schmitt trigger circuit 7 is LOW, the Pch-MOS transistors P8 and P9 turn on, and the Nch-MOS transistor N8 turns off, thereby setting the output to HIGH. Since the output is HIGH, the Pch-MOS transistor P10 is OFF. With the Pch-MOS transistor P10 being OFF, the illustrated circuit operates as an inverter. When the input rises, the output falls according to the input-and-output characteristics of the inverter. The threshold of this case is the positive transition threshold VSCHMITT of the input. Once the output is set to LOW, the Pch-MOS transistor P10 turns on to pull down the potential of a node 10. This turns off the Pch-MOS transistor P9. Accordingly, even if the input potential falls and becomes marginally lower than the threshold VSCHMITT, the output does not return to HIGH. When the input is HIGH after the positive transition, the Pch-MOS transistors P8 and P9 are OFF, and the Nch-MOS transistor N8 is ON.

In the following, an operation regarding a negative transition of the input will be described. Since the Pch-MOS transistor P10 is ON at the beginning, the potential of the node 10 which is the source node of the Pch-MOS transistor P9 is pulled down. In order for the Pch-MOS transistor P9 to turn on, the input potential needs to show a sufficient drop such as to pull up the potential of the node 10 by the Pch-MOS transistor P8. Thus, a negative transition threshold of the input is lower than VSCHMITT. When the input potential becomes lower than the negative transition threshold of the input, the output is set to HIGH. In response, the Pch-MOS transistor P10 becomes nonconductive, with the Pch-MOS transistors P8 and P9 being ON, and the Nch-MOS transistor N8 being OFF. As the Pch-MOS transistor P10 is nonconductive, the output does not change even if the input potential becomes marginally higher than the negative transition threshold of the input.

Figure 11:
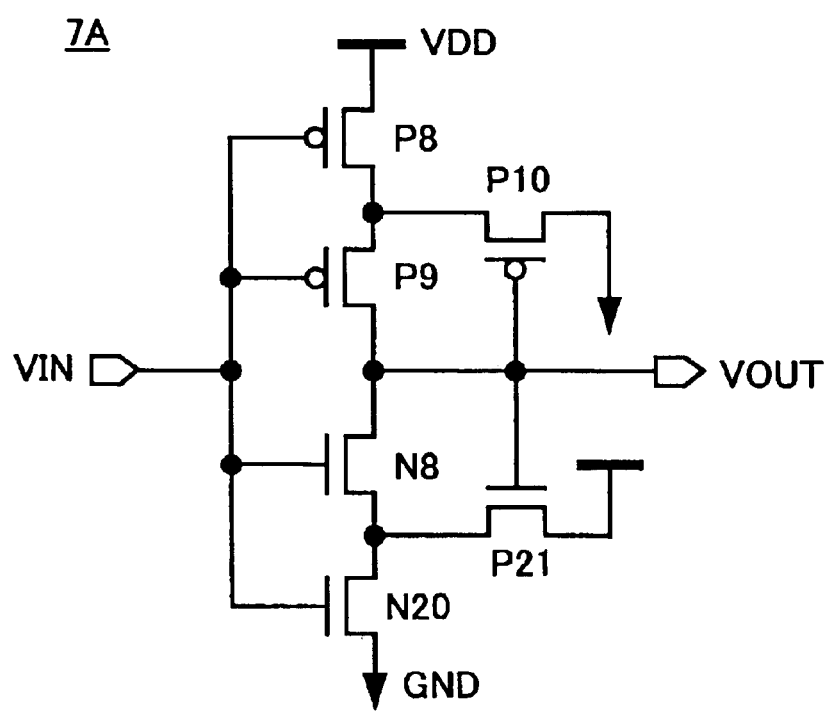
FIG. 11 is a circuit diagram showing another example of the construction of the Schmitt trigger circuit.
Figure 12:
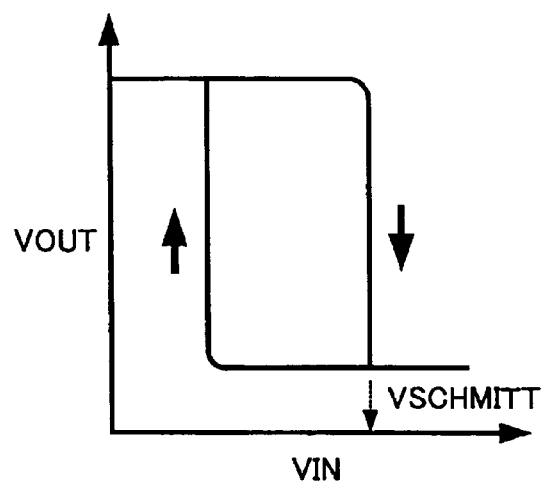
FIG. 12 is a diagram showing the input-and-output characteristics of the Schmitt trigger circuit of FIG. 11.

FIG. 11 is a circuit diagram showing another example of the construction of the Schmitt trigger circuit. FIG. 12 is a diagram showing the input-and-output characteristics of the Schmitt trigger circuit of FIG. 11.

A Schmitt trigger circuit 7A shown in FIG. 11 has a circuit construction that is generally known and widely used. The Schmitt trigger circuit 7A includes Pch-MOS transistors P8–P10 and Nch-MOS transistors N8, N20, and N21. When FIG. 12 showing the input-and-output characteristics of the Schmitt trigger circuit 7A of FIG. 11 is compared with FIG. 10 showing the input-and-output characteristics of the Schmitt trigger circuit 7, it can be understood that the Schmitt trigger circuit 7 has the positive transition threshold VSCHMITT that is relatively low. This is because the operation at the time of input positive transition is the same as the operation of an inverter.

As previously described, the sense amplifier 6 is a latch-type sense amplifier, and its gain is highest when the input potential is around VDD/2. If the positive transition threshold VSCHMITT needs to be set around this potential, the construction of the Schmitt trigger circuits 7 and 8 shown in FIG. 8 may be used. If the positive transition threshold VSCHMITT can be set to a higher potential, the Schmitt trigger circuit 7A of FIG. 11 may be used.

Figure 13:
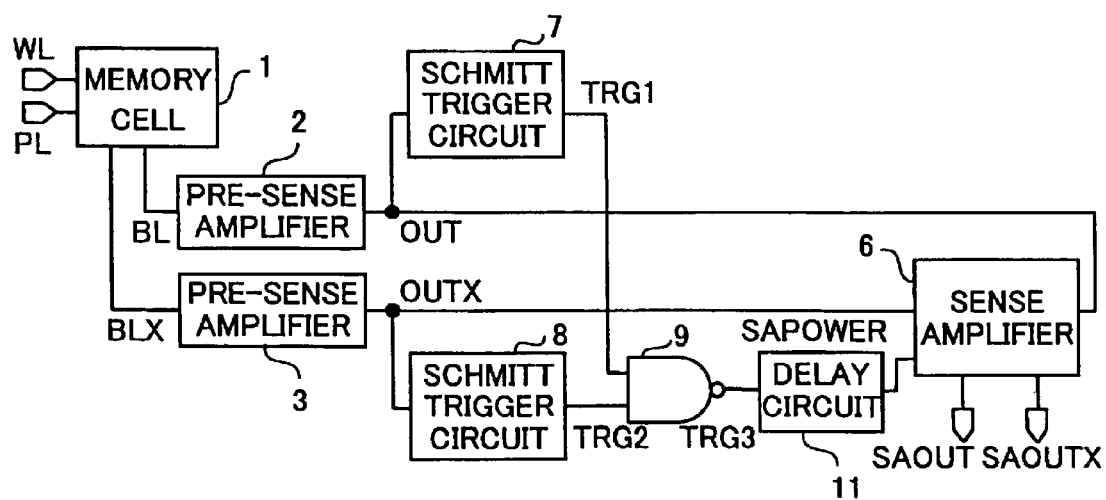
FIG. 13 is a block diagram showing a variation of the construction of the ferroelectric memory according to the invention.

FIG. 13 is a block diagram showing a variation of the construction of the ferroelectric memory according to the invention. In FIG. 13, the same elements as those of FIG. 5 are referred to by the same numerals, and a description thereof will be omitted.

The circuit shown in FIG. 13 differs from the construction of FIG. 5 in that a delay circuit 11 is provided. An output TRG3 of the NAND gate 9 is supplied to the sense amplifier 6 through the delay circuit 11 as the latch drive signal SAPOWER.

Figure 14:
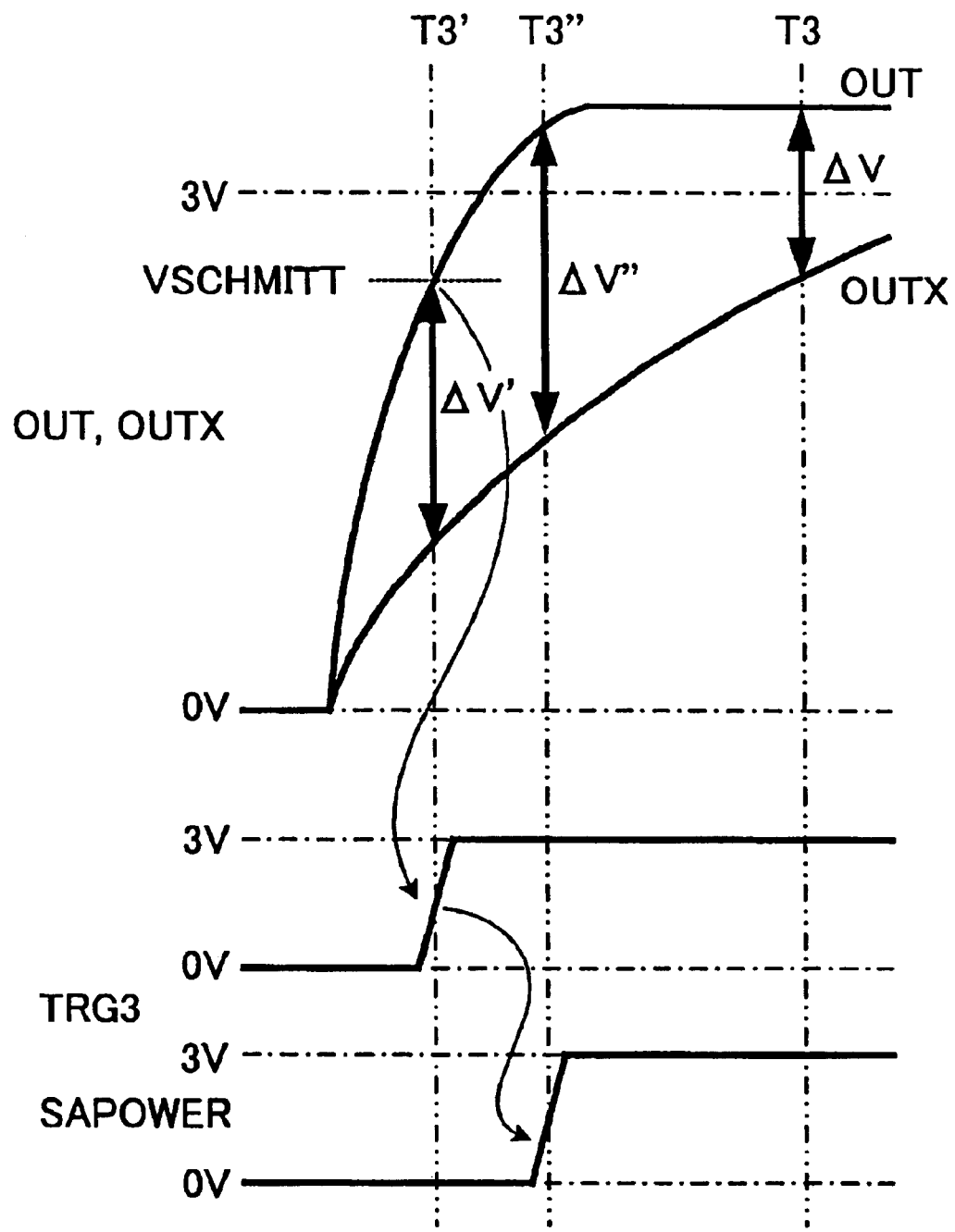
FIG. 14 is a diagram showing signal waveforms for explaining the operation of the circuit of FIG. 13.

FIG. 14 is a diagram showing signal waveforms for explaining the operation of the circuit of FIG. 13. FIG. 14 illustrates a case in which the potentials of the nodes OUT and OUTX rise excessively due to manufacturing variation and/or temperature and power supply dependency of memory cell capacitors. Like in the case of FIG. 6, the node OUT saturates, so that a potential difference ΔV is small at timing T3. When the node OUT reaches the positive transition threshold VSCHMITT of the input of the Schmitt trigger circuit 7, the output TRG1 of the Schmitt trigger circuit 7 changes to LOW, resulting in the output TRG3 of the NAND gate 9 being set to HIGH. This change to HIGH appears as a change to HIGH of the latch drive signal SAPOWER after a predetermined delay through the delay circuit 11.

As shown in FIG. 14, a potential difference between the nodes OUT and OUTX reaches its maximum around timing T3" where the node OUT saturates. Therefore, if the effect of a gain change of the sense amplifier 6 is not significantly large, it is desirable to start a latch operation at the timing T3". At this timing, however, the potential of the node OUT is above VDD (e.g., 3 V). Unfortunately, the threshold VSCHMITT of the Schmitt trigger circuit cannot be set higher than VDD. In consideration of this, the construction of FIG. 13 detects an event that the node OUT reaches the threshold VSCHMITT at timing T3', and the latch drive signal SAPOWER is set to HIGH at timing T3' after waiting for the predetermined time period. With this provision, the sense amplifier 6 successfully detects a potential difference ΔV" that is larger than a potential difference ΔV' at timing T3', thereby avoiding incorrect sensing in a reliable manner.

Further, the present invention is not limited to these embodiments, but various variations and modifications may be made without departing from the scope of the present invention.

What is claimed is:

1. A semiconductor memory device, comprising:
   a memory cell;
   a signal line on which a potential responsive to data read from said memory cell appears;
   a potential detecting circuit which outputs a detection signal in response to detecting that the potential on said signal line exceeds a predetermined potential; and
   a sense amplifier which starts amplifying the potential on said signal line in response to the detection signal.

2. The semiconductor memory device as claimed in claim 1, wherein said memory cell includes two ferroelectric capacitors for storing complementary data, and said signal line includes two signal lines corresponding to said two ferroelectric capacitors, and wherein said potential detecting circuit includes two potential detecting circuits provided for respective ones of said two signal lines, and said sense amplifier starts amplifying data on said two signal lines when either one of said two potential detecting circuits outputs the detection signal.

3. The semiconductor memory device as claimed in claim 1, further comprising:
   a bit line on which a potential responsive to the data read from said memory cell appears; and
   a pre-sense amplifier which amplifies the potential on said bit line for provision to said signal line.

4. The semiconductor memory device as claimed in claim 1, wherein said potential detecting circuit is a Schmitt trigger circuit.

5. The semiconductor memory device as claimed in claim 4, wherein an input-and-output characteristic of said Schmitt trigger circuit with respect to an input positive transition is identical to an input-and-output characteristic of an inverter that includes a Pch-MOS transistor and an Nch-MOS transistor connected in series.

6. The semiconductor memory device as claimed in claim 1, further comprising a delay circuit which delays the detection signal output from said potential detecting circuit for provision to said sense amplifier.

7. A semiconductor memory device, comprising:
   a memory cell which includes two ferroelectric capacitors for storing complementary data;
   two bit lines each connected to a corresponding one of said two ferroelectric capacitors through a transistor;
   two pre-sense amplifiers each coupled to a corresponding one of said two bit lines for amplifying a potential;
   two potential detecting circuits each coupled to an output of a corresponding one of said two pre-sense amplifiers to output a detection signal in response to detecting that the output of the corresponding one of said two pre-sense amplifiers exceeds a predetermined potential; and
   a sense amplifier coupled to outputs of said two pre-sense amplifiers to start amplification in response to the detection signal that is output from either one of said two potential detecting circuits.

8. The semiconductor memory device as claimed in claim 7, wherein said potential detecting circuit is a Schmitt trigger circuit.

9. The semiconductor memory device as claimed in claim 8, wherein an input-and-output characteristic of said Schmitt trigger circuit with respect to an input positive transition is identical to an input-and-output characteristic of an inverter that includes a Pch-MOS transistor and an Nch-MOS transistor connected in series.

10. The semiconductor memory device as claimed in claim 7, further comprising a delay circuit which delays the detection signal output from said potential detecting circuit for provision to said sense amplifier.

* * * * *